United States Patent [19]

Tokura et al.

[11] Patent Number: 4,550,308
[45] Date of Patent: Oct. 29, 1985

[54] SIGNAL CONVERTING APPARATUS

[75] Inventors: Norihito Tokura, Aichi; Hisasi Kawai, Toyohashi; Tokio Kohama, Nishio; Kenji Kanehara, Aichi, all of Japan

[73] Assignee: Nippon Soken, Inc., Nishio, Japan

[21] Appl. No.: 486,840

[22] Filed: Apr. 20, 1983

[30] Foreign Application Priority Data

Apr. 21, 1982 [JP] Japan .................................. 57-65408

[51] Int. Cl.[4] ........................................... H03K 13/20
[52] U.S. Cl. .............................. 340/347 NT; 307/261
[58] Field of Search ................. 347/347 NT; 307/261; 332/9

[56] References Cited

U.S. PATENT DOCUMENTS

| 3,441,877 | 4/1969 | Thompson | 340/347 NT |
| 3,541,446 | 11/1970 | Prozeller | 340/347 NT |
| 3,955,191 | 5/1976 | Lambourn | 340/347 NT |
| 4,075,623 | 2/1978 | Futagawa | 340/347 NT |
| 4,112,428 | 9/1978 | Dorsman | 340/347 NT |
| 4,228,366 | 10/1980 | Hütteman et al. | 307/261 |

Primary Examiner—B. Dobeck
Attorney, Agent, or Firm—Cushman, Darby & Cushman

[57] ABSTRACT

A signal converting apparatus for converting voltage into a pulse signal with a corresponding pulse-width comprises a switching circuit for selecting either one of an input voltage to be converted or a constant voltage depending upon a binary switching signal. The selected voltage is integrated with respect to time by an integrating circuit. When the output from the integrating circuit has reached an upper limit voltage or a lower limit voltage, the above-mentioned binary switching signal which is an output signal of this signal converting apparatus is inverted by a comparator/inverter circuit.

14 Claims, 8 Drawing Figures

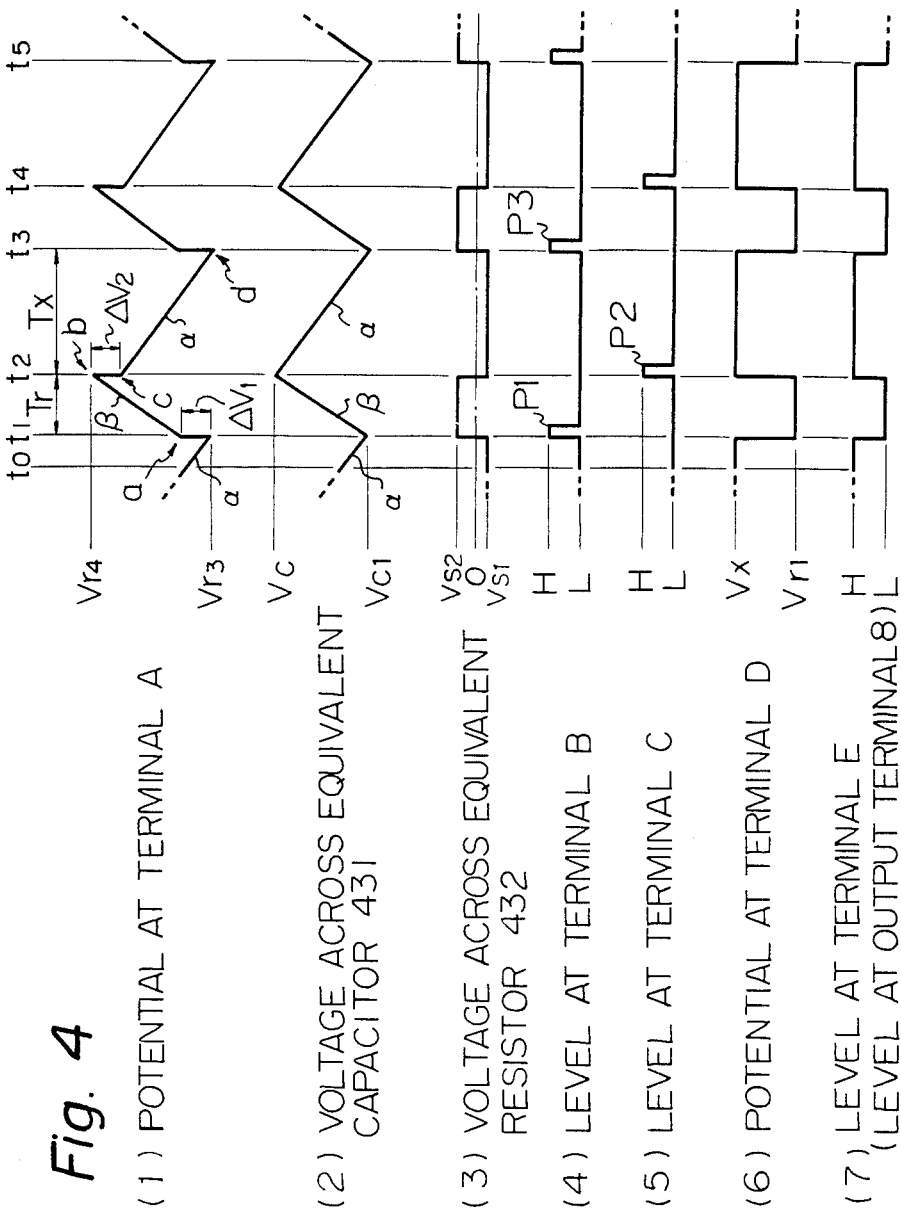

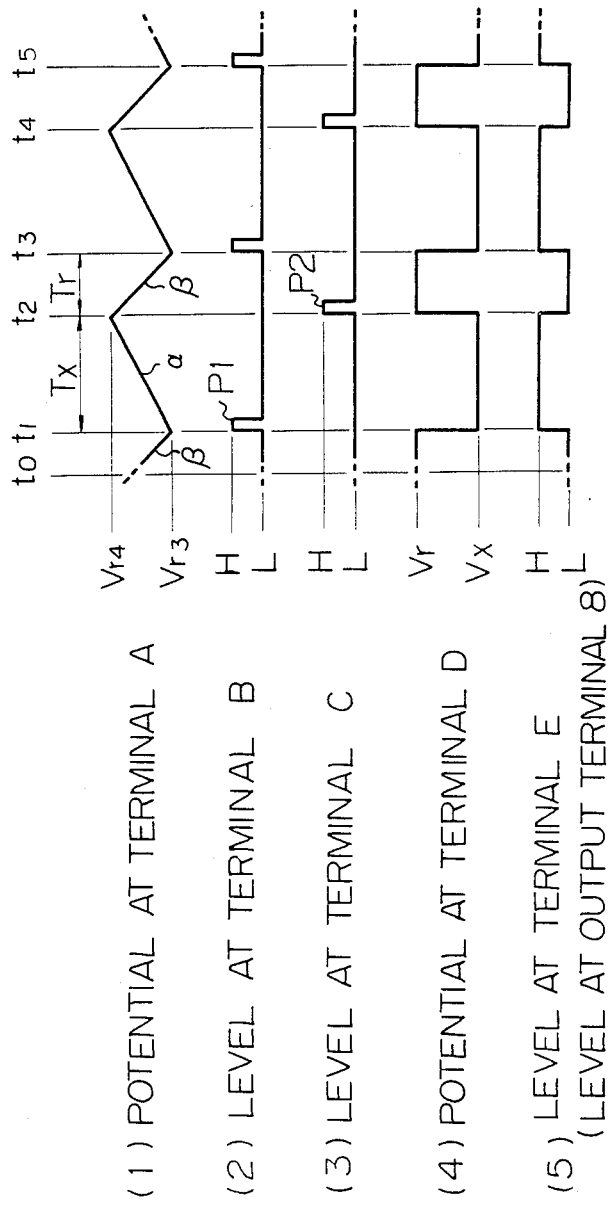

SIGNAL CONVERTING APPARATUS

BACKGROUND OF THE INVENTION

1. Field of the Invention

The present invention relates to an apparatus for converting a voltage signal into a pulse signal with a pulse-width corresponding to the voltage level of the voltage signal, in other words, it relates to an analog-to-digital (A-D) converter for converting voltage into a pulse signal with a corresponding time width.

2. Description of the Prior Art

A double integrating circuit can be cited as a representative example of the A-D converter for converting the voltage into a time width. According to the A-D converter of this type, precision in the A-D conversion is not affected by the precision of a charge-discharge capacitor or resistor of the integrating circuit, or by variance in the frequency of clock signals. However, dielectric loss of the charge-discharge capacitor turns out to produce errors in the A-D conversion. Therefore, when the A-D converter is to be constructed in the form of a hybrid integrated circuit, the use of a chip capacitor having dielectric loss is impossible. The charge-discharge capacitor must thus be provided outside the circuit, which makes it difficult to reduce the size as a whole.

Further, the A-D converters on the market have been so constructed that the converted digital values establish a linear relation relative to input voltages, so that they can be used for general purposes. Therefore, error in the voltage that is to be converted, which corresponds to the error of one digit, increases with the decrease in voltage. When the commercially available A-D converters are to be used, therefore, it is attempted to increase the number of bits in order to increase precision in the region of low voltages. If the number of bits is increased, however, the circuit operates maintaining unnecessarily increased precision in excess of a required precision in a region of high voltages, and the manufacturing cost is increased unnecessarily.

SUMMARY OF THE INVENTION

It is therefore an object of the present invention to provide a signal converting apparatus which can carry out the signal conversion without being affected by dielectric loss of the charge-discharge capacitor in the integrating circuit and, thus, can be easily constructed in the form of a hybrid integrated circuit.

Another object of the present invention is to provide a signal converting apparatus which can maintain the same precision when high and low voltages are to be converted.

The above objects are achieved by an apparatus for converting an input voltage signal into an output pulse signal having a pulse-width corresponding to the voltage level of the input voltage signal, comprising: a first voltage supply means for producing a voltage signal having a constant voltage level; means for selecting either one of the input voltage signals or the constant voltage signal, in response to the output pulse signal; means for integrating the selected signal from the selecting means with respect to time, to produce an output signal; and means for comparing the voltage level of the output signal from the integrating means with a lower limit voltage level and with an upper limit voltage level, and for inverting the level of the output pulse signal when the voltage level of the output signal is from the integrating means is lower than or equal to the lower limit voltage level and when the voltage level of the output signal from the integrating means is higher than or equal to the upper limit voltage level.

The above and other related objects and features of the present invention will be apparent from the description of the present invention set forth below, with reference to the accompanying drawings, as well as from the appended claims.

BRIEF DESCRIPTION OF THE DRAWINGS

FIG. 4 is a diagram of signal waveforms related to the integrating circuit of FIG. 3;

FIG. 8 is a diagram of signal waveforms according to the third embodiment.

DESCRIPTION OF THE PREFERRED EMBODIMENTS

Figure 1:
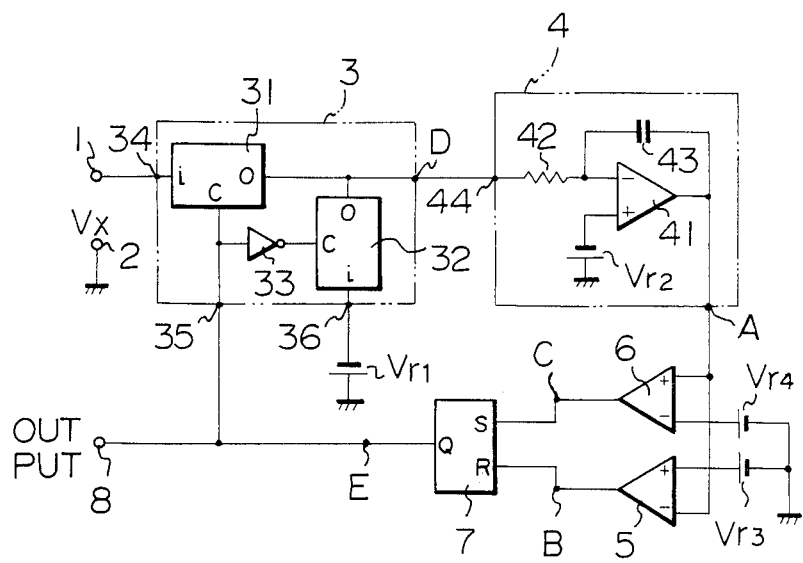
FIG. 1 is a circuit diagram of a first embodiment of the present invention.

FIG. 1 is a circuit diagram of an A-D converter according to a first embodiment of the present invention, in which reference numerals 1 and 2 denote input terminals to which will be applied a positive voltage Vx that is to be converted, and 3 denotes an analog switching circuit.

The analog switching circuit 3 consists of a first analog switch 31 (e.g., Model CD4066 produced by RCA CO.), a second analog switch 32 (e.g. model CD4066 produced by RCA Co.), and a NOT logic gate 33.

An input terminal i of the first analog switch 31 is connected to a first input terminal 34 of the analog switching circuit 3. An input terminal i of the second analog switch 32 is connected to a second input terminal 36 of the analog switching circuit 3. A third input terminal 35 of the analog switching circuit 3 is connected to a control terminal c of the first analog switch 31 and to an input terminal of the NOT logic gate 33. An output terminal of the NOT logic gate 33 is connected to a control terminal c of the second analog switch 32. An output terminal o of the first analog switch 31 and an output terminal o of the second analog switch 32 are commonly connected to an output terminal D of the analog switching circuit 3.

Also, in FIG. 1, reference numeral 4 denotes an integrating circuit which consists of an operational amplifier 41, an input resistor 42, a charge-discharge capacitor 43, and a constant-voltage supply $V_{r2}$ for producing negative constant voltage.

An input terminal 44 of the integrating circuit 4 is connected to an end of the input resistor 42, and the other end of the input resistor 42 is connected to an inverting input terminal of the operational amplifier 41. The charge-discharge capacitor 43 is connected across the inverting input terminal and the output terminal of the operational amplifier 41. Constant-voltage supply $Vr_2$ for producing negative constant voltage (integration reference voltage) is connected to a non-inverting input terminal of the operational amplifier 41. Output terminal of the operational amplifier 41 is connected to output terminal A of the integrating circuit 4.

In FIG. 1, furthermore, reference numerals 5 and 6 denote a first comparator and a second comparator (e.g., Model CD3290 produced by RCA Co.), respectively.

Inverting input terminal of the first comparator 5 and non-inverting input terminal of the second comparator 6 are commonly connected to the output terminal A of the integrating circuit 4. A non-inverting input terminal of the first comparator 5 is connected to a constant-voltage supply $Vr_3$ for producing a constant lower limit voltage, and an inverting input terminal of the second comparator 6 is connected to a constant-voltage supply $Vr_4$ for producing a constant upper limit voltage. An output terminal B of the first comparator 5 and an output terminal C of the second comparator 6 are connected, respectively, to a reset input terminal (R) and a set input terminal (S) of a set-reset (RS) flip-flop 7 (e.g., Model CD4013 produced by RCA Co.). A Q output terminal E of the RS flip-flop 7 is connected to the third input terminal 35 of the analog switching circuit 3 as well as to a digital output terminal 8 of the A-D converter.

Further, the input terminal 1 of the A-D converter is connected to the first input terminal 34 of the above-mentioned analog switching circuit 3, and the second input terminal 36 of the analog switching circuit 3 is connected to the constant voltage supply $Vr_1$ for producing negative constant voltage. Moreover, an output terminal D of the analog switching circuit 3 is connected to an input terminal 44 of the aforementioned integrating circuit 4. Here, FIG. 1 does not illustrate power supplies to each of the circuits.

Operation of the A-D converter illustrated in FIG. 1 will be described below in conjunction with a diagram of signal waveforms of FIG. 2.

First, the operation is described at a time $t_0$. At this time, if the logic level at the Q output terminal E of the RS flip-flop 7 assumes the "H" level as shown in FIG. 2(5), the first analog switch 31 in the analog switcing circuit 3 receives the "H" level through its control terminal c and is rendered conductive, while the second analog switch 32 receives through its control terminal the "L" level which is inverted by the NOT logic gate 33, and is rendered nonconductive. Therefore, a positive voltage Vx which is to be converted shown in FIG. 2(4) appears at the output terminal D of analog switching circuit 3. This positive voltage Vx is applied to the integrating circuit 4 which performs the integrating operation at a time constant determined by the input resistor 42 and the charge-discharge capacitor 43. Here, since the input voltage Vx and the negative constant voltage (integration reference voltage) $Vr_2$ is always $Vx > Vr_2$, the charge-discharge capacitor 43 is electrically charged. Therefore, potential of the output terminal A of the integrating circuit 4 decreases with the lapse of time maintaining a predetermined gradient $\alpha$ as shown in FIG. 2(1). The gradient $\alpha$ is determined by the operation principle of the integrating circuit, and is given by the following formula relying upon the positive voltage Vx that is to be converted, negative constant voltage $Vr_2$, resistance R of the input resistor 42, and electrostatic capacitance C of the charge-discharge capacitor 43.

$$\alpha = \frac{Vr_2 - Vx}{C \cdot R} \quad (1)$$

where the dimension of $\alpha$ is [V/sec].

Figure 2:
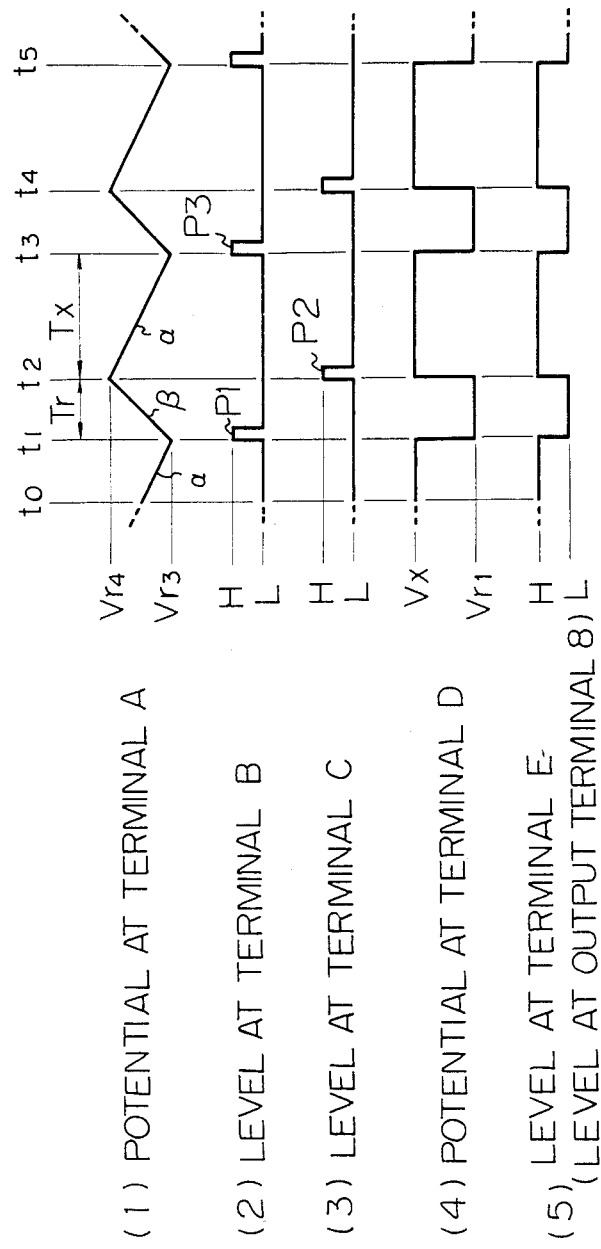
FIG. 2 is a diagram of signal waveforms according to the first embodiment.

At the time $t_1$, potential of the output terminal A of the integrating circuit 4 reaches a constant lower limit voltage $Vr_3$ as shown in FIG. 2(1), whereby the first comparator 5 operates to produce a pulse P1 at the output terminal B as shown in FIG. 2(2). The RS flip-flop circuit 7 is reset by the pulse P1, and the logic level at the output terminal E of the RS flip-flop 7 changes from the "H" level to the "L" level at the time $t_1$ as shown in FIG. 2(5). Responsive to the change in the logic level, the first analog switch 31 in the analog switching circuit 3 is changed from the conductive state to the nonconductive state at the time $t_1$, and the second analog switch 32 is changed from the nonconductive state to the conductive state at the time $t_1$. Therefore, potential at the output terminal D of the analog switching circuit 3 changes from the positive voltage Vx to the negative constant voltage $Vr_1$ at the time $t_1$ as shown in FIG. 2(4). This negative constant voltage $Vr_1$ is then applied to the input terminal 44 of the integrating circuit 4. Since the above-mentioned negative constant voltage $Vr_1$ and the negative constant voltage (integration reference voltage) $Vr_2$ of the integrating circuit 4 have been so determined that $Vr_1 < Vr_2$, the charge-discharge capacitor 43 in the integrating circuit assumes the discharging state. Therefore, after having assumed the lower limit value $Vr_3$ at the time $t_1$, potential at the output terminal A of the integrating circuit 4 increases with the lapse of time maintaining a predetermined gradient $\beta$ as shown in FIG. 2(1). The gradient $\beta$ is determined by the operation principle of the integrating circuit 4, and is given by the following formula relying upon negative constant voltages $Vr_1$, $Vr_2$, resistance R of the input resistor 42, and electrostatic capacitance C of the charge-discharge capacitor 43.

$$\beta = \frac{Vr_2 - Vr_1}{C \cdot R} \quad (2)$$

where dimension of $\beta$ is [V/sec].

At a time $t_2$, potential at the output terminal A of the integrating circuit 4 reaches a constant voltage $Vr_4$ as shown in FIG. 2(1), whereby the second comparator 6 operates and produces a pulse P2 at the output terminal C as shown in FIG. 2(3). The RS flip-flop 7 is set by the pulse P2, and the logic level at the output terminal E change from the "L" level to the "H" level at the time $t_2$ as shown in FIG. 2(5). Responsive to the change in the logic level, the first analog switch 31 in the analog switching circuit 3 changes from the nonconductive state to the conductive state at the time $t_2$, and the second analog switch 32 changes from the conductive state to the nonconductive state. Therefore, potential at the output terminal D of the analog switching circuit 3 changes from the negative constant voltage $Vr_1$ to the positive input voltage Vx at the time $t_2$ as shown in FIG. 2(4). This positive voltage Vx to be converted is applied to the input terminal 44 of the integrating circuit 4. Since there exists the relation $Vx > Vr_2$ as mentioned earlier, the charge-discharge capacitor 43 is charged, and potential at the output terminal A of the integrating circuit 4 decreases maintaining the gradient α after having assumed the upper limit value $V_{r4}$ at the time $t_2$.

At a time $t_3$, the operation is carried out quite in the same manner as the above-mentioned case of time $t_1$; i.e., potential at the output terminal A of the integrating circuit 4 increases after having assumed the lower limit value $V_{r3}$ as shown in FIG. 2(1).

Thus, operations are continuously repeated as mentioned with regard to the times $t_1$ to $t_3$, and potential at the output terminal A of the integrating circuit 4 continuously increases and decreases between the upper limit value $V_{r4}$ and the lower limit value $V_{r3}$, as shown in FIG. 2(1) maintaining the gradient β when it increases and the gradient α when it decreases, to describe a triangular waveform.

Responsive to the voltage of a triangular waveform which is produced at the output terminal A of the integrating circuit 4 as shown in FIG. 2(1), rectangular waves of logic levels shown in FIG. 2(5) are produced at the output terminal E of the RS flip-flop 7, i.e., rectangular waves are produced at the output terminal 8 of the A-D converter. That is the output terminal 8 produces the output of the "L" level during a period of from time $t_1$ to time $t_2$, and produces the output of the "H" level during a period of from time $t_2$ to time $t_3$. Thus, outputs of the "H" level and "L" level are produced alternatingly.

Time period Tr in which the output appearing on the output terminal 8 assumes the "L" level (i.e., period of from time $t_1$ to time $t_2$) and time period Tx in which the output assumes the "H" level (i.e., period of from time $t_2$ to time $t_3$), can be found as described below.

As is obvious from FIG. 2(1), potential change ΔV at the output terminal A of the integrating circuit 4 is given by the following relation:

$$\Delta V = V_{r4} - V_{r3} \tag{3}$$

As is obvious from FIG. 2(1), furthermore, the following relation among the term Tr of the "L" level, the potential change V, and the gradient β exists:

$$Tr = \Delta V / \beta \tag{4}$$

If equations (2) and (3) are substituted for the equation (4) to eliminate ΔV and β, the following equation is obtained:

$$Tr = \frac{V_{r4} - V_{r3}}{V_{r2} - V_{r1}} \times C \cdot R \tag{5}$$

As will be obvious from FIG. 2(1), furthermore, the following relation exists among the term Tx of the "H" level, the potential change ΔV, and the gradient α;

$$Tx = \frac{\Delta V}{-\alpha} \tag{6}$$

If the equations (1) and (3) are substituted for the equation (6) to eliminate ΔV and α, the following equation is obtained:

$$Tx = \frac{V_{r4} - V_{r3}}{V_x - V_{r2}} \times C \cdot R \tag{7}$$

From the equations (5) and (7), Tx/Tr is found to be as follows:

$$\frac{Tx}{Tr} = \frac{\frac{V_{r4} - V_{r3}}{V_x - V_{r2}} \times C \cdot R}{\frac{V_{r4} - V_{r3}}{V_{r2} - V_{r1}} \times C \cdot R} = \frac{V_{r2} - V_{r1}}{V_x - V_{r2}} \tag{8}$$

It is understood from the above equation (8) that the ratio Tx/Tr of the term Tr of the "L" level and the term Tx of the "H" level, is determined quite independently of the constant voltages $V_{r3}$, $V_{r4}$, resistance R of the input resistor 42, or the electrostatic capacitance C of the charge-discharge capacitor 43, and is determined by the positive voltage Vx, to be converted, alone, provided there is no change in the voltages $V_{r1}$ and $V_{r2}$.

The foregoing description has dealt with the case when the charge-discharge capacitor 43 in the integrating circuit 4 has no dielectric loss tangent, i.e., when the dielectric loss tangent "tan δ" is zero. Mentioned below is a case when the dielectric loss tangent "tan δ" is not zero.

Figure 3:
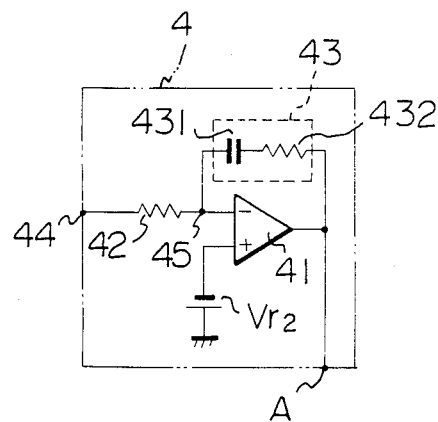
FIG. 3 is a diagram of an equivalent circuit of an integrating circuit when there exists a dielectric loss tangent in the charge-discharge capacitor of the integrating circuit in the first embodiment.

In this case, the charge-discharge capacitor 43 is expressed by an equivalent circuit consisting, as shown in FIG. 3, of an equivalent capacitor 431 and an equivalent resistor 432 that are connected in series with each other. Based upon an electrostatic capacitance Ce of equivalent capacitor 431 and a resistance Re of equivalent resistor 432, a dielectric loss tangent "tan δ" of the charge-discharge capacitor 43 is given by the following equation, $$\tan \delta = \frac{Re}{\omega \cdot Ce} \tag{9}$$

where ω denotes an angular frequency.

Below the operation of the A-D converter when the dielectric loss tangent "tan δ" is not zero is mentioned, i.e., when resistance Re of the equivalent resistor 432 is not zero, in conjunction with the circuit diagrams of FIGS. 1 and 3, and the diagram of signal waveforms of FIG. 4. The following description does not deal with those which were mentioned already in conjunction with the diagram of signal waveforms of FIG. 2.

At a time $t_0$, if the Q output terminal E of RS flip-flop 7 has the "H" logic level as shown in FIG. 4(7), the first analog switch 31 in the analog switching circuit 3 assumes the conductive state, the second analog switch 32 assumes the nonconductive state, and a positive voltage Vx that is to be converted appears at the output terminal D of the analog switching circuit 3 as shown in FIG. 4(6). The positive voltage Vx to be changed, is applied to the integrating circuit 4 which performs the integrating operation at a time constant determined by the input resistor 42 and the charge-discharge capacitor 43. In the integrating circuit 4, since the relation between the positive input voltage Vx and the negative constant voltage $V_{r2}$ is always $Vx > V_{r2}$, the charge-discharge capacitor 43 is charged, and potential at the output terminal A decreases maintaining a constant gradient α as shown in FIG. 4(1). In this case, voltage Vc across the equivalent capacitor 431 in the charge-discharge capacitor 43 decreases maintaining a gradient which is the same as the gradient α of FIG. 4(1), as shown in FIG. 4(2). Further, voltage Vs across the equivalent resistor 432 assumes a value $V_{s1}$ as shown in FIG. 4(3). This voltage $V_{s1}$ is determined by a charging current $I_{c1}$ of the charge-discharge capacitor 43 and the resistance Re of the equivalent resistor 432, as given by:

$$V_{s1} = I_{c1} \cdot Re \quad (10)$$

The charging current $I_{c1}$ is determined by the principle of integrating operation, and is given by the following equation from the input voltage $V_x$, negative constant voltage $V_{r2}$ and resistance R of the input resistor 42:

$$I_{c1} = \frac{V_x - V_{r2}}{R} \quad (11)$$

If the equation (11) is substituted for the equation (10) to eliminate $I_{c1}$, the following equation is obtained:

$$V_{s1} = \frac{Re}{R} \cdot (V_x - V_{r2}) \quad (12)$$

In the integrating circuit 4 of FIG. 3, potential at the inverting input terminal 45 of the operational amplifier 41 is equal to the constant voltage $V_{r2}$ at the non-inverting input terminal at all times from the operation principle of the operational amplifier. Therefore, potential $V_A$ at the output terminal A of the integrating circuit 4 becomes the one which is obtained by subtracting the voltage $V_{s1}$ across the equivalent resistor 432 given by the equation (12) from the potential ($V_{r2} + V_c$) which consists of potential $V_{r2}$ at the inverting input terminal 45 and voltage $V_c$ across the equivalent capacitor 431. Namely, potential $V_A$ at the point A is given by:

$$V_A = V_{r2} + V_c - V_{s1} \quad (13)$$

As is obvious from the equation (12), voltage $V_{s1}$ across the equivalent resistor 432 remains constant if the voltage $V_x$ to be converted is constant.

At a time $t_1$, potential at the output terminal A of the integration circuit 4 reaches the constant lower limit voltage $V_{r3}$ as shown in FIG. 4(1), whereby the first comparator 5 operates to produce a pulse P1 at the output terminal B as shown in FIG. 4(4). Since the RS flip-flop 7 is reset by the pulse P1, the logic level at the output terminal E changes from the "H" level to the "L" level at the time $t_1$ as shown in FIG. 4(7). Responsive to the change in the logic level, the first analog switch 31 in the analog switching circuit 3 changes from the conductive state to the nonconductive state, and the second analog switch 32 changes from the nonconductive state to the conductive state. Therefore, potential at the output terminal D of the analog switching circuit 3 changes from the positive voltage $V_x$ into the negative constant voltage $V_{r1}$ at the moment $t_1$ as shown in FIG. 4(6). The negative constant voltage $V_{r1}$ is applied to the integrating circuit 4. Here, since the relation between the negative constant voltage $V_{r1}$ and the negative constant voltage $V_{r2}$ of the integrating circuit 4 is so maintained that $V_{r1} < V_{r2}$, the charge-discharge capacitor 43 undergoes the discharge. Accordingly, potential at the output terminal A of the integrating circuit 4 increases maintaining a predetermined gradient $\beta$ after having assumed the lower limit value $V_{r3}$ at the time $t_1$ as shown in FIG. 4(1). In this case, voltage $V_c$ across the equivalent capacitor 431 in the charge-discharge capacitor 43 increases maintaining the same gradient $\beta$ as that of FIG. 4(1) after having assumed a minimum value $V_{c1}$ at the time $t_1$ as shown in FIG. 4(2). A voltage $V_{s2}$ across the equivalent resistor 432 is given by the following equation from a discharge current $I_{c2}$ of the charge-discharge capacitor 43 and the resistance Re of the equivalent resistor 432:

$$V_{s2} = -I_{c2} \cdot Re \quad (14)$$

The discharge current $I_{c2}$ is determined by the principle of integrating operation, and is given by the following equation from the negative constant voltage $V_{r1}$, negative constant voltage $V_{r2}$, and resistance R of the input resistor 42:

$$I_{c2} = \frac{V_{r2} - V_{r1}}{R} \quad (15)$$

If the equation (15) is substituted for the equation (14) to eliminate $I_{c2}$, the following equation results:

$$V_{s2} = \frac{Re}{R} \cdot (V_{r2} - V_{r1}) \quad (16)$$

In the integrating circuit 4 of FIG. 3, potential at the inverting input terminal 45 of the operational amplifier 41 is equal to the constant voltage $V_{r2}$ of the non-inverting input terminal at all times, due to the operation principle of the operational amplifier. Therefore, potential $V_A$ at the output terminal A of the integrating circuit 4 becomes equal to the one which is obtained by adding votage $V_{s2}$ across the equivalent resistor 432 given by the equation (16) to the potential ($V_{r2} + V_c$) which consists of the potential $V_{r2}$ at the inverting input terminal 45 and the voltage $V_c$ across the equivalent capacitor 431. Namely, potential $V_A$ at the output terminal A is given by the following equation:

$$V_A = V_{r2} + V_c + V_{s2} \quad (17)$$

Thus, the direction of current flowing into the charge-discharge capacitor 43 is reversed before and after the time $t_1$. Namely, voltage Vs across the equivalent resistor 432 is put to subtraction as given by the equation (13) before the time $t_1$, and is put to addition as given by the equation (17) after the time $t_1$. Just at the time $t_1$, therefore, a skip $\Delta V_1$ develops in the potential $V_A$ at the output terminal A as shown in FIG. 4(1). The skip $\Delta V_1$ is the one which is obtained by subtracting $V_A$ given by the equation (13) from $V_A$ given by the equation (17). Namely, the skip $\Delta V_1$ is given by:

$$\begin{aligned}\Delta V_1 &= (V_{r2} + V_c + V_{s2}) - (V_{r2} + V_c - V_{s1}) \\ &= V_{s2} + V_{s1}\end{aligned} \quad (18)$$

Here, if the equations (12) and (16) are substituted for the equation (18) to eliminate $V_{s1}$, $V_{s2}$, the skip $\Delta V_1$ is expessed by the following equation:

$$\begin{aligned}\Delta V_1 &= \frac{Re}{R} \cdot (V_x - V_{r2}) + \frac{Re}{R} \cdot (V_{r2} - V_{r1}) \\ &= \frac{Re}{R} \cdot (V_x - V_{r1})\end{aligned} \quad (19)$$

As is obvious from the equation (19), the skip $\Delta V_1$ is determined by the input voltage $V_x$ alone, if there is no change in the negative constant voltage $V_{r1}$.

At a time $t_3$, potential at the output terminal A of the integrating circuit 4 reaches a constant upper limit voltage $V_{r4}$ as shown in FIG. 4(1). Therefore, the second comparator 6 operates to produce a pulse P2 at the output terminal C as shown in FIG. 4(5). Since the RS flip-flop 7 is set by the pulse P2, the logic level at the output terminal E changes from the "L" level to the "H" level at the time $t_2$ as shown in FIG. 4(7). Responsive to the change in the logic level, the first analog switch 31 in the analog switching circuit 3 changes from the nonconductive state to the conductive state, and the second analog switch 32 changes from the conductive state to the nonconductive state. Therefore, potential at the output terminal D of the analog switching circuit 3 changes from the negative constant voltage $Vr_1$ to the positive voltage Vx to be converted, at the time $t_2$ as shown in FIG. 4(6). The positive voltage Vx to be converted is applied to the integrating circuit 4. Here, since the relation between the positive input voltage Vx and the negative constant voltage $Vr_2$ of the integrating circuit 4 is $Vx > Vr_2$, the charge-discharge capacitor 43 is charged. Therefore, potential at the output terminal A of the integrating circuit 4 decreases maintaining a constant gradient $\alpha$ after having assumed the upper limit value $Vr_4$ at the time $t_2$ as shown in FIG. 4(1). In this case, voltage Vc across the equivalent capacitor 431 in the charge-discharge capacitor 43 decreases maintaining the same gradient $\alpha$ as that of FIG. 4(1) after having assumed the maximum value $Vc_2$ at the time $t_2$, as shown in FIG. 4(2). Since the gradient $\alpha$ is equal to the gradient $\alpha$ at the time $t_0$ of FIG. 4(1), the aforementioned equations (10) to (13) hold true after the time $t_3$. Therefore, the equation (17) holds true just before the time $t_2$, and the equation (13) holds true again just after the time $t_2$. At just the time $t_2$, therefore, a skip $\Delta V_2$ develops in the potential $V_A$ at the output terminal A as shown in FIG. 4(1). This skip $\Delta V_2$ is obtained by subtracting $V_A$ which is given by the equation (13) from $V_A$ which is given by the equation (17). Namely, the skip $\Delta V_2$ is given by:

$$\Delta V_2 = (Vr_2 + Vc + Vs_2) - (Vr_2 + Vc - Vs_1) \quad (20)$$
$$= Vs_2 + Vs_1$$

Here, if the equations (12) and (16) are substituted for the equation (20) to eliminate $Vs_1$, $Vs_2$, the skip $\Delta V_2$ is expressed by the following equation:

$$\Delta V_2 = \frac{Re}{R} \cdot (Vx - Vr_1) \quad (21)$$

If the equation (21) is compared with the equation (19), the skip $\Delta V_2$ is equal to the skip $\Delta V_1$; i.e., $$\Delta V_1 = \Delta V_2 \quad (22)$$

At the time $t_3$, the operation is carried out quite in the same manner as in the case of the time $t_1$ shown in FIG. 4(1). Namely, potential at the output terminal A of the integrating circuit 4 increases after having assumed the lower limit value $Vr_3$, while developing skip $\Delta V_1$ at the time $t_3$.

Thus, operations are continuously repeated as mentioned with regard to the times $t_1$ to $t_3$, and potential $V_A$ at the output terminal A of the integrating circuit 4 continuously increases and decreases between the upper limit value $Vr_4$ and the lower limit value $Vr_3$ as shown in FIG. 4(1), maintaining the gradient $\beta$ when it increases and the gradient $\alpha$ when it decreases, to describe a triangular waveform. Here, however, the skip $\Delta V_1$ is produced at a time (for example, time $t_1$) when the potential $V_A$ assumes the lower limit value $Vr_3$, and the skip $\Delta V_2$ is produced at a time (for example, time $t_2$) when the potential $V_A$ assumes the upper limit value $Vr_4$. As mentioned in the foregoing (equation (22)), these skips $\Delta V_1$ and $\Delta V_2$ are equal to each other. Further, as is obvious from the equations (19) and (21), the skips $\Delta V_1$ and $\Delta V_2$ become zero if resistance Re of the equivalent resistor 432 in the charge-discharge capacitor 43 of FIG. 3 is zero.

Responsive to the voltage of a triangular waveform which is produced at the output terminal A of the integrating circuit 4 as shown in FIG. 4(1), rectangular waves of logic levels shown in FIG. 4(7) are produced at the output terminal E of the RS flip-flop 7, i.e., rectangular waves are produced at the output terminal 8 of the A-D converter. That is, the output terminal 8 produces the output of the "L" level during a period of from time $t_1$ to time $t_2$, and produces the output of the "H" level during a period of from time $t_2$ to time $t_3$. Thus, outputs of the "H" level and "L" level are produced alternatingly.

Term Tr in which the output appearing on the output terminal 8 assumes the "L" level (i.e., period of from time $t_1$ to $t_2$) and term Tx in which the output assumes the "H" level (i.e., period of from time $t_2$ to time $t_3$), can be found as described below.

As shown in FIG. 4(1), change $\Delta V$ in the potential $V_A$ at the output terminal A of the integrating circuit 4 is given by the equation (3). Here, however, the skips $\Delta V_1$ and $\Delta V_2$ last for such short periods of time that they can be virtually neglected. Therefore, the section of gradient $\beta$ is from point a to point b, and the section of gradient $\alpha$ is from point c to point d. From the equation (22), $\Delta V_1 = \Delta V_2$, and the potential change from point a to point b is equal to the potential change from point c to point d. Namely, this potential change $\Delta V'$ is given by:

$$\Delta V' = (Vr_4 - Vr_3) - \Delta V_1 \quad (23)$$

If the equations (23) and (2) are substituted for the equation (4) to eliminate $\Delta V'$ and $\beta$, the following equation is obtained:

$$Tr = \frac{(Vr_4 - Vr_3) - \Delta V_1}{Vr_2 - Vr_1} \times C \cdot R \quad (24)$$

On the other hand, if the equations (23) and (1) are substituted for the equation (6) to eliminate $\Delta V'$ and $\alpha$, the following equation is obtained:

$$Tx = \frac{(Vr_4 - Vr_3) - \Delta V_1}{Vx - Vr_2} \times C \cdot R \quad (25)$$

From the equations (24) and (25), the ratio Tx/Tr is found to be:

$$\frac{Tx}{Tr} = \frac{\dfrac{(Vr_4 - Vr_3) - \Delta V_1}{Vx - Vr_2} \times C \cdot R}{\dfrac{(Vr_4 - Vr_3) - \Delta V_1}{Vr_2 - Vr_1} \times C \cdot R} = \frac{Vr_2 - Vr_1}{Vx - Vr_2} \quad (26)$$

It is understood from the above equation (26) that the ratio Tx/Tr of the term Tr of the "L" level and the period Tx of the "H" level, is determined quite independently of the constant voltages $Vr_3$, $Vr_4$, resistance R of the input resistor 42, or electrostatic capacitance C of the charge-discharge capacitor 43, or quite independently of the dielectric loss tangent "tan δ" of the charge-discharge capacitor 43 caused by equivalent resistance 432 contained therein, but is determined by the positive voltage Vx aline to be converted, provided there is no change in the voltages $Vr_1$ and $Vr_2$.

Figure 5:
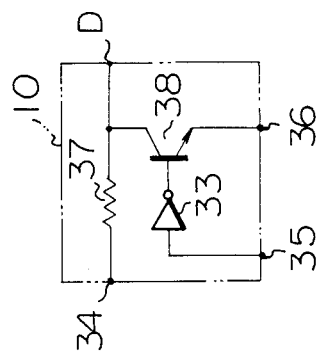
FIG. 5 is a diagram of an analog switching circuit according to a second embodiment of the present invention.

Described below is the A-D converter according to a second embodiment of the present invention. In the second embodiment, the analog switching circuit 3 shown in FIG. 1 is replaced by an analog switching circuit 10 which is illustrated in FIG. 5. Therefore, the setup is quite the same as that of the first embodiment with regard to other respects.

In the analog switching circuit 10, an input resistor 37 is connected between a first input terminal 34 and an output terminal D. An input terminal of a NOT logic gate 33 is connected to a third input terminal 35 of the analog switching circuit 10, and an output terminal of the NOT logic gate 33 is connected to the base of a switching transistor 38 of which the emitter is connected to a second input terminal 36 of the analog switching circuit 10, and of which the collector is connected to the output terminal D.

Operation of the A-D converter of this embodiment will be described below in conjunction with the diagrams of signal waveforms of FIGS. 2 and 6. The analog switching circuit 10 of FIG. 5 fundamentally operates in the same manner as the analog switching circuit 3 of FIG. 1. In this case, however, the potential appearing on the output terminal A changes maintaining a slightly different gradient due to different time constant for integration of the integrating circuit 4.

Figure 6:
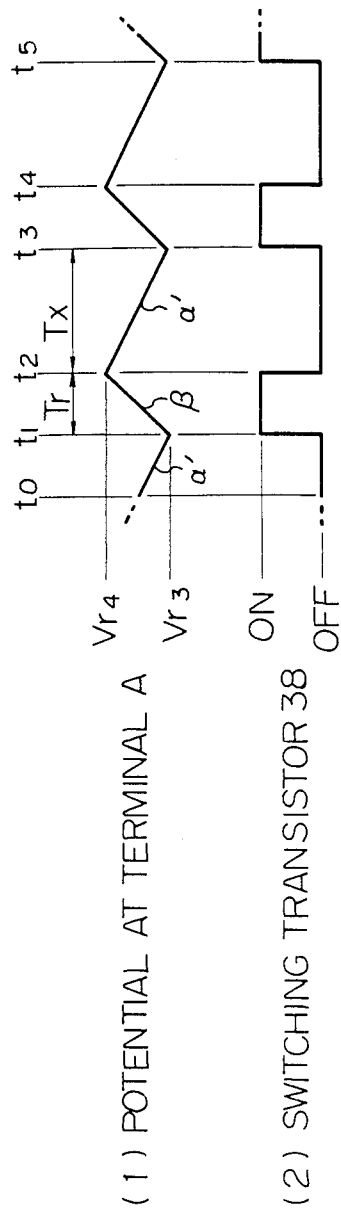
FIG. 6 is a diagram of signal waveforms according to the second embodiment.

The potential waveform of FIG. 6(1) at the output terminal A of the integrating circuit 4 of this embodiment is the same as the potential waveform of FIG. 2(1) which appears at the output terminal A, with regard to the fact that it describes a triangular waveform with the constant voltages $Vr_4$ and $Vr_3$ as the upper limit value and the lower limit value, respectively. As shown in FIG. 6(2), the switching transistor 38 is rendered conductive during the term Tr in which the output terminal E of the RS flip-flop 7 assumes the "L" level, and is rendered nonconductive during the term Tx in which the output terminal E assumes the "H" level. Therefore, the integrating operation is carried out in the same manner as in the first embodiment, and the triangular waves appearing on the output terminal A of the integrating circuit 4 possess the gradient $\beta$ of FIG. 2(1) during the term Tr, as shown in FIG. 6(1). During the term Tx, however, the gradient in the case of FIG. 6(1) is $\alpha'$ which is smaller than the gradient $\alpha$ of FIG. 2(1), being affected by the input resistance 37 in the analog switching circuit 10.

The gradient $\alpha'$ can be found as mentioned below. During the term Tx, the terminal E assumes the "H" level, and the terminal D possesses the potential Vx as shown in FIGS. 2(5), 2(4). Therefore, the integrating circuit 4 performs the integrating operation at a time constant which is determined by the resistance R of the input resistor 42, electrostatic capacitance C of the charge-discharge capacitor 43, and resistance $R_1$ of the input resistor 37 in the analog switching circuit 10 of FIG. 5. Accordingly, the gradient $\beta'$ of FIG. 6(1) during the term Tx is expressed by:

$$\alpha' = \frac{Vr_2 + Vx}{C \cdot (R + R_1)} \quad (27)$$

Here, the equation (27) is the one in which R in the denominator of the equation (1) is replaced by $(R+R_1)$ If $\alpha'$ of the equation (27) is substituted for $\alpha$ of the equation (6), and if the equation (3) is further substituted to eliminate $\alpha'$ and $\Delta V$, the following equation is obtained:

$$Tx = \frac{Vr_4 - Vr_3}{Vx - Vr_2} \times C \cdot (R + R_1) \quad (28)$$

From the equations (28) and (5), the ratio Tx/Tr can be found to be:

$$\frac{Tx}{Tr} = \frac{\dfrac{Vr_4 - Vr_3}{Vx - Vr_2} \times C \cdot (R + R_1)}{\dfrac{Vr_4 - Vr_3}{Vr_2 - Vr_1} \times C \cdot R} = \quad (29)$$

$$\frac{Vr_2 - Vr_1}{Vx - Vr_2} \times \frac{R + R_1}{R}$$

From the equation (29), it is understood that the ratio Tx/Tr of the term Tr in which the output terminal assumes the "L" level and the term Tx in which the output terminal assumes the "H" level of this embodiment, is equal to the value which is obtained by multiplying the equation (8) which is the result of the first embodiment by $(R+R_1)/R$. That is, the ratio Tx/Tr is determined by the positive voltage Vx, to be converted, alone, provided negative constant voltages $Vr_1$, $Vr_2$, resistance R of the input resistor 42, and resistance $R_1$ of the input resistor 37 remain constant.

Figure 7:
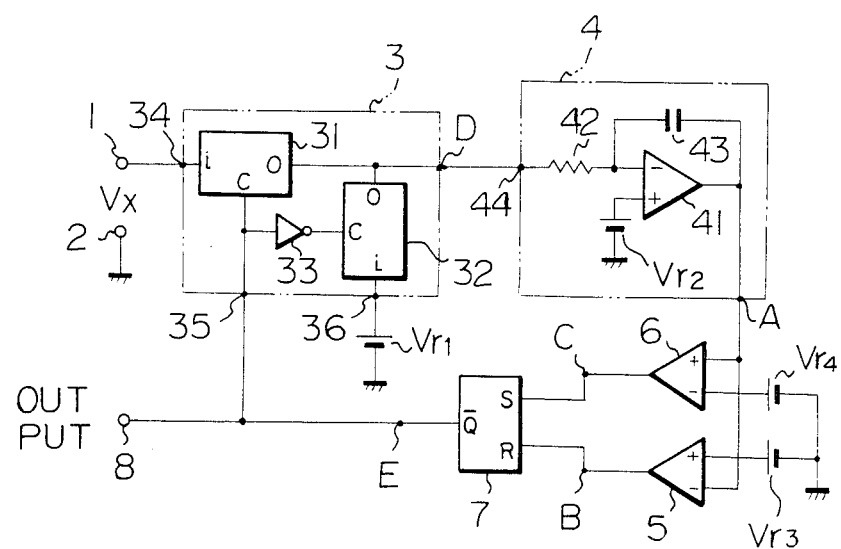
FIG. 7 is a circuit diagram according to a third embodiment of the present invention.

Described below is the A-D converter according to a third embodiment of the present invention. FIG. 7 illustrates the circuit setup according to the third embodiment. In the third embodiment, the output terminal E of the RS flip-flop 7 serves as the Q output side, the voltage Vx to be converted has negative constant voltage, $Vr_1$ and $Vr_2$ denote positive constant voltages maintaining a relation $Vr_1 > Vr_2$, in contrast with those of the first embodiment illustrated in FIG. 1. With regard to other respects, the setup is quite the same as that of the first embodiment.

Operation of the A-D converter according to this embodiment will be described below in conjunction with a diagram of signal waveforms of FIG. 8. As shown in FIG. 8(1), potential at the output terminal A of the integrating circuit 4 increases from a time $t_1$ to time $t_2$ maintaining the gradient $\alpha$. This period corresponds to the term Tx of FIG. 2(1). The potential then decreases from the time $t_2$ to a time $t_3$ maintaining the gradient $\beta$ as shown in FIG. 8(1). This period corresponds to the term Tr of FIG. 2(1). Namely, the waveform of FIG. 8(1) is the same as the inverted waveform of FIG. 2(1). In the third embodiment, the relation of gradients $\alpha$, $\beta$ and terms Tx, Tr, is quite the same as that of the first embodiment. In the third embodiment, therefore, equations (1) to (8) of the first embodiment can be adapted, and the ratio Tx/Tr is given by the equation (8). Therefore, the third embodiment provides quite the same effects as the first embodiment.

In the first and second embodiments, the voltage Vx to be converted is the positive constant voltage and the voltages $Vr_1$ and $Vr_2$ are negative constant voltages maintaining a relation $Vr_1 < Vr_2$ Provided the requirement $Vr_1 < Vr_2 < Vx$ is satisfied, however, the A-D conversion operation can be properly carried out irrespective of the polarities of the voltages $V_{r_1}$, $V_{r_2}$ and Vx. In the third embodiment, furthermore, the voltage Vx to be converted possesses negative constant voltage and the constant voltages $V_{r_1}$ and $V_{r_2}$ possesses positive constant voltage, maintaining a relation $V_{r_1} > V_{r_2}$. Provided the requirement $V_{r_1} > V_{r_2} > V_x$ is satisfied, however, the A-D conversion operation can be properly carried out irrespective of the polarities of the voltages $V_{r_1}$, $V_{r_2}$ and Vx.

According to the present invention as described above in detail, the A-D converter comprises a switching circuit which selects either one of a voltage that is to be converted or a constant voltage depending upon a binary switching signal, an integrating circuit which integrates the voltage selected by the switching circuit with regard to time, and a comparator/inverter circuit which inverts the switching signal when the output voltage of the integrating circuit has reached an upper limit voltage or a lower limit voltage, wherein the switching signal is produced as an output signal. Therefore, the duty ratio of switching signals establishes a hyperbolic function relative to the voltage that is to be converted. Consequently, any effects by the dielectric loss tangent of the charge-discharge capacitor in the integrating circuit are eliminated, and the A-D converter can be easily realized in the form of a hybrid integrated circuit. Further, the circuit construction can be simplified since no clock oscillator circuit is required. Moreover, since the voltage to be converted and the duty ratio of output signals establish a hyperbolic function, error of the voltage to be converted relative to one-digit error becomes small toward the side of low voltages and becomes large toward the side of high voltages, when the duty ratio of output signals is counted by a counter circuit. Consequently, the same reading precision is maintained even when high voltages are to be converted or low voltages are to be converted. Accordingly, the number of bits needs not be increased unnecessarily, and the manufacturing cost does not increase.

As many widely different embodiments of the present invention may be constructed without departing from the spirit and scope of the present invention, it should be understood that the present invention is not limited to the specific embodiments described in this specification, except as defined in the appended claims.

We claim:

1. An apparatus for converting a voltage signal into a pulse signal having a pulse-width corresponding to the voltage level of said voltage signal, comprising:
   input means for generating an input voltage to be pulse-width converted; and
   conversion means for converting said input voltage generated by said input means into an output pulse signal having a pulse-width corresponding to the voltage level of said input voltage signal; said conversion means comprising:
   (a) first voltage supply means for producing a voltage signal having a constant voltage level;
   (b) means for selecting either said input voltage signal or said constant voltage signal, in response to said output pulse signal of said conversion means;
   (c) integrating means for integrating the selected signal selected by said selecting means with respect to time, to produce an integrated signal; and
   (d) means for comparing the voltage level of said integrated signal from said integrating means with a lower limit voltage level and with an upper limit voltage level, and for inverting the level of said output pulse signal of said conversion means when the voltage level of said integrated signal from said integrating means is less than or equal to said lower limit voltage level and when the voltage level of said integrated signal from said integrating means is greater than or equal to the upper limit voltage level.

2. An apparatus as claimed in claim 1, wherein said integrating means includes an integrator means for producing an integrated signal which is the integral of said selected signal with respect to time, said integrated signal increasing with respect to time when said selected signal is said constant voltage signal from said first voltage supply means and decreasing with respect to time when said selected signal is said input voltage signal.

3. An apparatus as claimed in claim 2, wherein said integrator means further comprises:
   second voltage supply means for producing a voltage signal having a constant voltage level which is lower than said voltage level of said input voltage signal and higher than said voltage level of the voltage signal from said first voltage supply means; and
   an integrator circuitry means for producing an integrated signal which is the integral of said selected signal with respect to time, by using said voltage signal from said second voltage supply means as an integration reference voltage.

4. An apparatus as claimed in claim 3, wherein said input voltage signal always has a positive voltage level, and said voltage signals from said first and second voltage supply means have voltage levels.

5. An apparatus as claimed in claim 1, wherein said integrating means includes an integrator means for producing an integrated signal which is the integral of said selected signal with respect to time, said integrated signal decreasing with respect to time when said selected signal is said constant voltage signal from said first voltage supply means, and increasing with respect to time when said selected signal is said input voltage signal.

6. An apparatus as claimed in claim 5, wherein said integrator means further comprises:
   second voltage supply means for producing a voltage signal having a constant voltage level which is higher than the voltage level of said input voltage signal and lower than the voltage level of said voltage signal from said first voltage supply means; and
   integrator ciruitry means for producing an integrated signal which is the integral of said selected signal wiht respect to time, using said voltage signal from said second voltage supply means as an integration reference voltage.

7. An apparatus as claimed in claim 6, wherein said input voltage signal alswayas has a negative voltage level, and said voltage signals from said first and second voltage supply means have constant positive voltage levels.

8. An apparatus as claimed in claim 1, wherein said selecting means includes two analog switches which alternately and mutually exclusively close in response to said output pulse signal of said conversion means.

9. An apparatus as claimed in claim 8, wherein said apparatus has an input terminal to which said input voltage signal is applied, and one of said two analog switches being connected between said input terminal and said integrating means, and the other of said two analog switches being connected between said first voltage supply means and said integrating means.

10. An apparatus as claimed in claim 1, wherein said apparatus has an input terminal to which said input voltage signal is applied, and said selecting means further comprises:

a resistor connected between said input terminal and said integrating means, and switch means connected between said first voltage supply means and said integrating means for closing in response to said output pulse signal of said conversion means.

11. An apparatus as claimed in claim 10, wherein said analog switch is a switching transistor.

12. An apparatus as claimed in claim 1, wherein said means for and for inverting comprises:

third voltage supply means for producing a voltage signal having a constant lower limit level;

fourth voltage supply means for producing a voltage signal having a constant lower limit level;

first comparator means for comparing the voltage level of said integrated signal from said integrating means with said lower limit level from said third voltage supply means, and for producing a pulse signal when said voltage level of said integrated signal is less than or equal to said lower limit level;

second comparator means for comparing the voltage level of said integrated signal from said integrating means with the said upper limit level of said voltage signal from said fourth voltage supply means, and for producing a pulse signal when said voltage level of said integrated signal is greater than or equal to said upper limit level; and inverting means for inverting the level of said output pulse signal of said conversion means in response to said pulse signal from said first and second comparator means.

13. An apparatus as claimed in claim 12, wherein said inverting means comprises a flip-flop triggered by said pulse signal from said first and second comparator means, to produce said output pulse signal of said conversion means.

14. An apparatus as claimed in claim 13, wherein said flip-flop is composed of a set-reset flip-flop having a reset input terminal connected to the output of said first comparator means, a set input terminal connected to the output of said second comparator means, and an output terminal for outputting said output pulse signal of said conversion means.

* * * * *

UNITED STATES PATENT AND TRADEMARK OFFICE
CERTIFICATE OF CORRECTION

PATENT NO. : 4,550,308

DATED : October 29, 1985

INVENTOR(S) : TOKURA et al

It is certified that error appears in the above-identified patent and that said Letters Patent is hereby corrected as shown below:

Column 14, line 37, "have voltage" should read:

--have constant negative voltage--

Column 14, line 57, "wiht" should read--with--

Signed and Sealed this

Fifteenth Day of July 1986

[SEAL]

Attest:

DONALD J. QUIGG

Attesting Officer

Commissioner of Patents and Trademarks